United States Patent
Gada et al.

(10) Patent No.: US 10,147,721 B1
(45) Date of Patent: Dec. 4, 2018

(54) METHOD AND APPARATUS FOR DYNAMIC CALIBRATION OF ON-DIE-PRECISION-RESISTORS

(71) Applicants: Sridhar V. Gada, Bangalore (IN); Sonu Arora, Princeton, NJ (US)

(72) Inventors: Sridhar V. Gada, Bangalore (IN); Sonu Arora, Princeton, NJ (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/847,996

(22) Filed: Dec. 20, 2017

(51) Int. Cl.
| | |
|---|---|
| *H01L 27/02* | (2006.01) |
| *H01L 27/06* | (2006.01) |
| *H03H 11/28* | (2006.01) |
| *H01L 23/34* | (2006.01) |
| *H01L 49/02* | (2006.01) |
| *H01L 21/8232* | (2006.01) |
| *G11C 17/16* | (2006.01) |
| *H03K 5/24* | (2006.01) |
| *H01L 23/525* | (2006.01) |

(52) U.S. Cl.
CPC ...... *H01L 27/0629* (2013.01); *H01L 21/8232* (2013.01); *H01L 23/34* (2013.01); *H01L 27/0211* (2013.01); *H01L 28/20* (2013.01); *H03H 11/28* (2013.01); *G11C 17/165* (2013.01); *H01L 23/5256* (2013.01); *H03K 5/24* (2013.01)

(58) Field of Classification Search
CPC combination set(s) only.
See application file for complete search history.

(56) References Cited

U.S. PATENT DOCUMENTS

| | | | |
|---|---|---|---|
| 5,854,534 A | 12/1998 | Beilin et al. | |
| 6,967,138 B2 | 11/2005 | Ding | |
| 8,929,127 B2 * | 1/2015 | Antonyan | G11C 11/1697 365/148 |
| 9,064,715 B2 | 6/2015 | Lee et al. | |
| 9,111,671 B2 * | 8/2015 | Dicke | H01C 10/50 |

(Continued)

FOREIGN PATENT DOCUMENTS

WO WO2008007258 1/2008

OTHER PUBLICATIONS

Tawfik Arabi et al.; Dampening High Frequency Noise in High Performance Microprocessor Packaging; IEEE; SPI 2004; pp. 53-56.

(Continued)

*Primary Examiner* — An Luu
(74) *Attorney, Agent, or Firm* — Timothy M. Honeycutt

(57) ABSTRACT

Various on-die-precision-resistor arrays, and methods of making and calibrating the same are disclosed. In one aspect, an apparatus is provided that includes a semiconductor chip and a precision resistor array on the semiconductor chip. A replica precision resistor array is on the semiconductor chip. The replica precision resistor array is configured to mimic the resistance behavior of the precision resistor array and has a characteristic resistance that is a function of temperature. The semiconductor chip is configured to calibrate the precision resistor array using the characterized resistance as a function of temperature, a resistance offset of the precision resistor array relative to the characterized resistance as a function of temperature, and a temperature of the precision resistor array.

20 Claims, 6 Drawing Sheets

(56) References Cited

U.S. PATENT DOCUMENTS

| | | |
|---|---|---|
| 2004/0221199 A1 | 11/2004 | Erenberger |
| 2005/0094465 A1 | 5/2005 | Gervasi et al. |
| 2005/0133930 A1 | 6/2005 | Savastisuk et al. |
| 2006/0087029 A1 | 4/2006 | Imanaka et al. |
| 2011/0075393 A1 | 3/2011 | Chandrasekaran et al. |
| 2011/0169164 A1 | 7/2011 | Nakamura et al. |
| 2012/0175731 A1 | 7/2012 | Chen et al. |
| 2013/0258627 A1 | 10/2013 | Guo et al. |

OTHER PUBLICATIONS

PCT/US2013/034238 International Search Report dated Aug. 21, 2013.

* cited by examiner

METHOD AND APPARATUS FOR DYNAMIC CALIBRATION OF ON-DIE-PRECISION-RESISTORS

BACKGROUND OF THE INVENTION

High speed I/O interfaces, such as USB and Ethernet, used in systems-on-chip or other processors require precision driving impedance for proper signal integrity. Conventional chips use impedance compensation circuits to maintain the requisite drive impedance. During mission mode operations, the I/O impedance of these interfaces can vary widely due to voltage and temperature variations. These impedance variations can impact the signal integrity and data throughput of the high speed interfaces. Typically, I/O interface impedance compensation circuits are regularly calibrated for temperature and voltage variations. These impedance compensation circuits rely on external high precision resistors for accurate impedance compensation. These external high precision resistors are typically located on a system board or in some other integrated circuit external to the chip hosting the high speed I/O interfaces.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
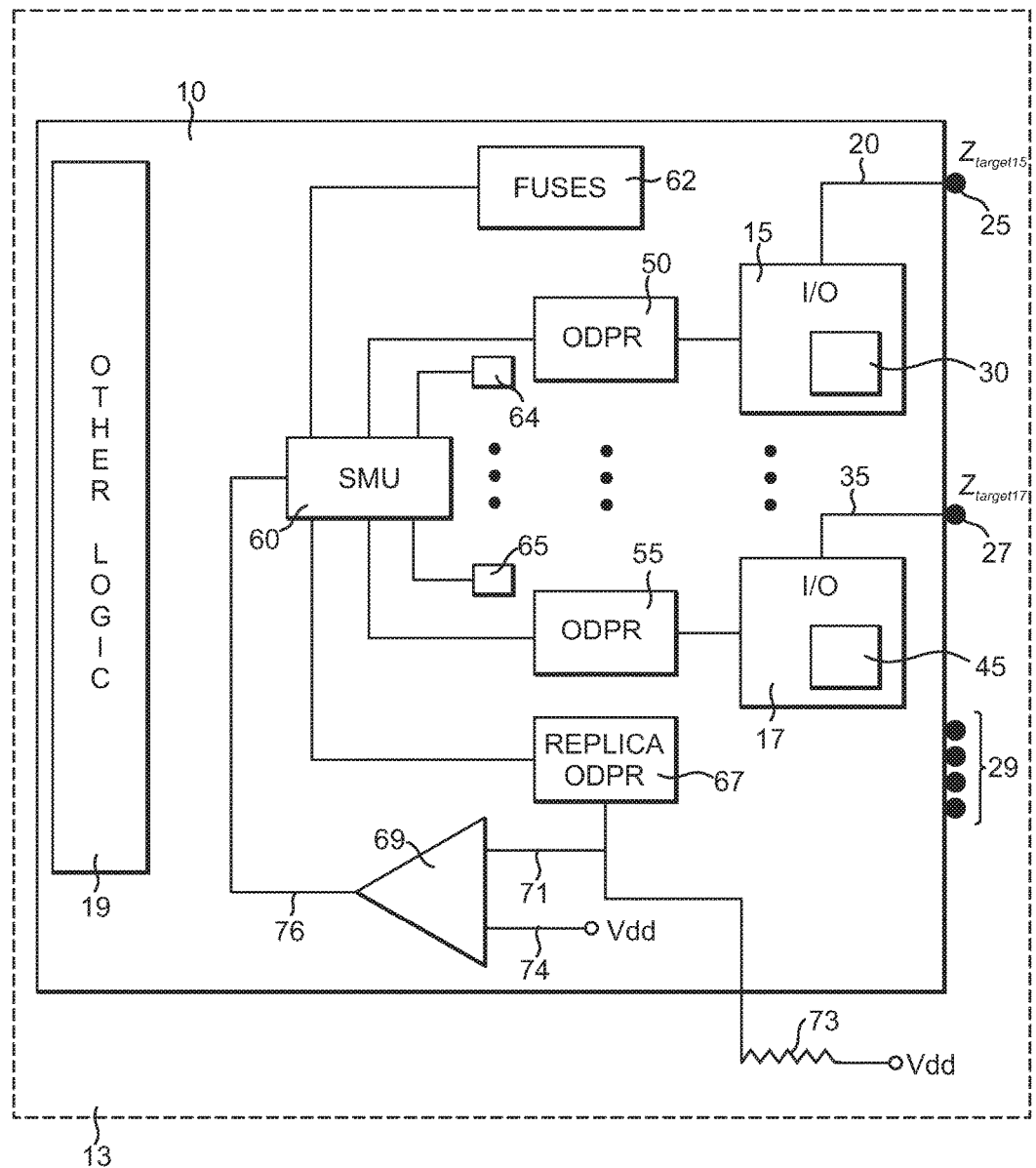
FIG. 1 is a block diagram of an exemplary electronic device and semiconductor chip device with precision resistor arrays and a replica precision array.

Current solutions for high speed I/O interface impedance compensation use external high precision resistors on a system board (motherboard) or an on-die-precision-resistor (ODPR). If a chip implements multiple different types of high speed I/O interfaces, then larger numbers of these high precision resistors will have to be used as reference in the respective impedance compensation circuits. When the conventional high precision resistors are implemented on the motherboard, a larger number of package pins/bumps will be required to accommodate the connections, thus increasing chip package cost and the overall bill of materials. In addition, off-die precision resistors present longer stubs from the resistors to the onboard impedance compensation circuits such that parasitics can adversely affect the accuracy of the resistors.

If the high precision resistors are implemented on die, they will require calibration for temperature variations during actual chip operation since the resistor values are sensitive to temperature variations. Big dies, such as systems-on-chip, with different types of high speed I/O interfaces with different target impedances and with large variations in the local temperature across the die require multiple instances of calibration circuits corresponding to each ODPR or impedance group, increasing the die real estate/ cost and production test time/cost.

In accordance with another aspect of the present invention, an apparatus is provided that includes a semiconductor chip and a precision resistor array on the semiconductor chip. A replica precision resistor array is on the semiconductor chip. The replica precision resistor array is configured to mimic the resistance behavior of the precision resistor array and has a characteristic resistance that is a function of temperature. The semiconductor chip is configured to calibrate the precision resistor array using the characterized resistance as a function of temperature, a resistance offset of the precision resistor array relative to the characterized resistance as a function of temperature, and a temperature of the precision resistor array.

In accordance with another aspect of the present invention, a method of manufacturing is provided that includes fabricating a precision resistor array on a semiconductor chip and a replica precision resistor array on the semiconductor chip. The replica precision resistor array is configured to mimic the resistance behavior of the precision resistor array and has a characteristic resistance that is a function of temperature. Logic is fabricated on the semiconductor chip that is configured to calibrate the precision resistor array using the characterized resistance as a function of temperature, a resistance offset of the precision resistor array relative to the characterized resistance as a function of temperature, and a temperature of the precision resistor array.

In accordance with another aspect of the present invention, a method of operating a semiconductor chip that has a precision resistor array and a replica precision resistor array configured to mimic the resistance behavior of the precision resistor array is provided. The method includes characterizing the resistance of the replica precision resistor array as a function of temperature, determining a resistance offset of the precision resistor array relative to the characterized resistance as a function of temperature, and calibrating the precision resistor array using the characterized resistance as a function of temperature, the resistance offset of the precision resistor array relative to the characterized resistance as a function of temperature, and a temperature of the precision resistor array.

In the drawings described below, reference numerals are generally repeated where identical elements appear in more than one figure. Turning now to the drawings, and in particular to FIG. 1, therein is shown a block diagram of an exemplary arrangement of a semiconductor chip device 10 that can be part of an electronic device 13. The semiconductor chip device 10 can be a semiconductor chip that can be any of a great variety of different types. A non-exhaustive list includes microprocessors, graphics processors, combined microprocessor/graphics processors, systems-on-chip, application specification integrated circuits or other type of integrated circuits. The electronic device 13 can be any of a great variety of electronic devices such as a notebook computer, a tablet computer, a smart phone, a general purpose computer, a game console, a digital television, a handheld mobile device, a server, a memory device, an add-in board such as a graphics card, or any other computing device employing integrated circuits.

The semiconductor chip device 10 includes plural I/O logic blocks 15 and 17 where the illustrated ellipses indicate that there may be many additional I/O logic blocks. The semiconductor chip device 10 includes other logic blocks, collectively labeled other logic 19, that are necessary to perform various mathematical and other electronic functions. The I/O blocks 15 and 17 are designed to drive signals and/or power for various types of I/Os. A non-exhaustive list includes PCI express, USB 2.0, 3.0 or later versions, USB type C, SATA, Ethernet, HDMI, DisplayPort, DDR or others. The I/O logic block 15 is designed to deliver signals to an output 20 leading to an I/O 25. The signals are driven with some target impedance $Z_{target15}$. Note that the semiconductor chip device 10 can include multitudes of I/Os, one of which is labeled 27 and a few more labeled collectively 29. The I/Os 25, 27 and 29 can be pins, solder balls or bumps, conductive pillars, lands, bond pads or other types of I/Os. The value of $Z_{target15}$ is determined by a variety of factors, such as interface type, e.g., USB, HDMI, etc., platform type, i.e., device or system board type or others. To ensure that $Z_{target15}$ meets specifications even when thermal drift occurs, the I/O logic block 15 includes an impedance compensation circuit 30 that is designed to keep the output to the I/O 25 within a selected margin above or below $Z_{target15}$. The I/O logic 17 similarly includes an output 35 leading to the I/O 27 with some target impedance $Z_{target17}$. It should be understood that $Z_{target15}$ through $Z_{target17}$ are selected according to a variety of factors, such as the particular type of I/O e.g., PCI express or USB, etc., as well as the overall architecture of the semiconductor chip device 10 and the various requirements of the electronic device 13. Like the I/O logic block 15, the I/O logic block 17 includes an impedance compensation circuit 45 that is designed to keep the target impedance $Z_{target17}$ at or within a specified range of some preselected target impedance. The I/O logic block 15 is connected to and works in conjunction with an on-die-precision-resistor (ODPR) array 50. The I/O logic block 17 is connected to and works in conjunction with another ODPR array 55 where the illustrated ellipses indicate that there may be many other ODPR arrays in addition to the ODPR arrays 50 and 55. The ODPR arrays 50 and 55 consist of plural parallel-connected resistors that can be selectively switched to provide selected resistive outputs so that the impedance compensation circuit 30 can effectively control the $Z_{target15}$ of the signals driven out to the I/O 25 and the impedance compensation circuit 45 can effectively control the $Z_{target17}$ of the signals driven out to the I/O 27 and so on for any additional I/O logic blocks. Additional details regarding an exemplary structure for the ODPR arrays 50 and 55 will be described in conjunction with a subsequent figure. Each of the ODPR arrays 50 and 55 is strategically located close to its respective impedance compensation circuit 30 and 45, respectively.

The ODPR arrays 50 and 55 can be controlled by a variety of structures. In this illustrative arrangement, a system management unit (SMU) 60 consists of logic and firmware to, among other things, control the settings of the ODPR arrays 50 and 55. The SMU 60 includes or is otherwise connected to plural fuses 62, which are used to store various control settings and values. The fuses 62 provide non-volatile storage of data. However, storage devices other than or in addition to fuses 62 could be used, such as data registers. Furthermore, the SMU 60 is connected to plural temperature sensing diodes 64 and 65, which are used to sense temperatures in close proximity to the physical locations of the ODPR arrays 50 and 55. The illustrated ellipses indicate that there may be many temperature sensing diodes in addition to the diodes 64 and 65. Temperature sensors other than diodes could be used.

To facilitate the rapid and efficient calibration of the ODPR arrays 50 and 55, the semiconductor chip device 10 includes a replica ODPR array 67 and a comparator circuit 69. As described in more detail below, the replica ODPR array 67 is designed to mimic the thermal behavior of the operational ODPR arrays 50 and 55. The replica ODPR array 67 is initially characterized to provide predictive parameters for subsequently calibrating the operational ODPR arrays 50 and 55. The replica ODPR array 67 is connected to and controlled by the SMU 60. One input 71 to the comparator circuit 69 consists of an output of the replica ODPR array 67 and an external high precision resistor 73 wired to form a voltage divider. Another input 74 to the comparator circuit 69 is a reference voltage input that includes a resistor network depicted in a subsequent figure. The input 74 and the external high precision resistor 73 each are connected to an input voltage Vdd. The external high precision resistor 73 can be positioned virtually anywhere in the electronic device 13, including on a package substrate (not shown) if the semiconductor chip device 10 is mounted on or otherwise part of a package, although shorter pathways to the comparator circuit 69 are preferred. The output 76 of the comparator circuit 69 is delivered to the SMU 60.

Figure 2:
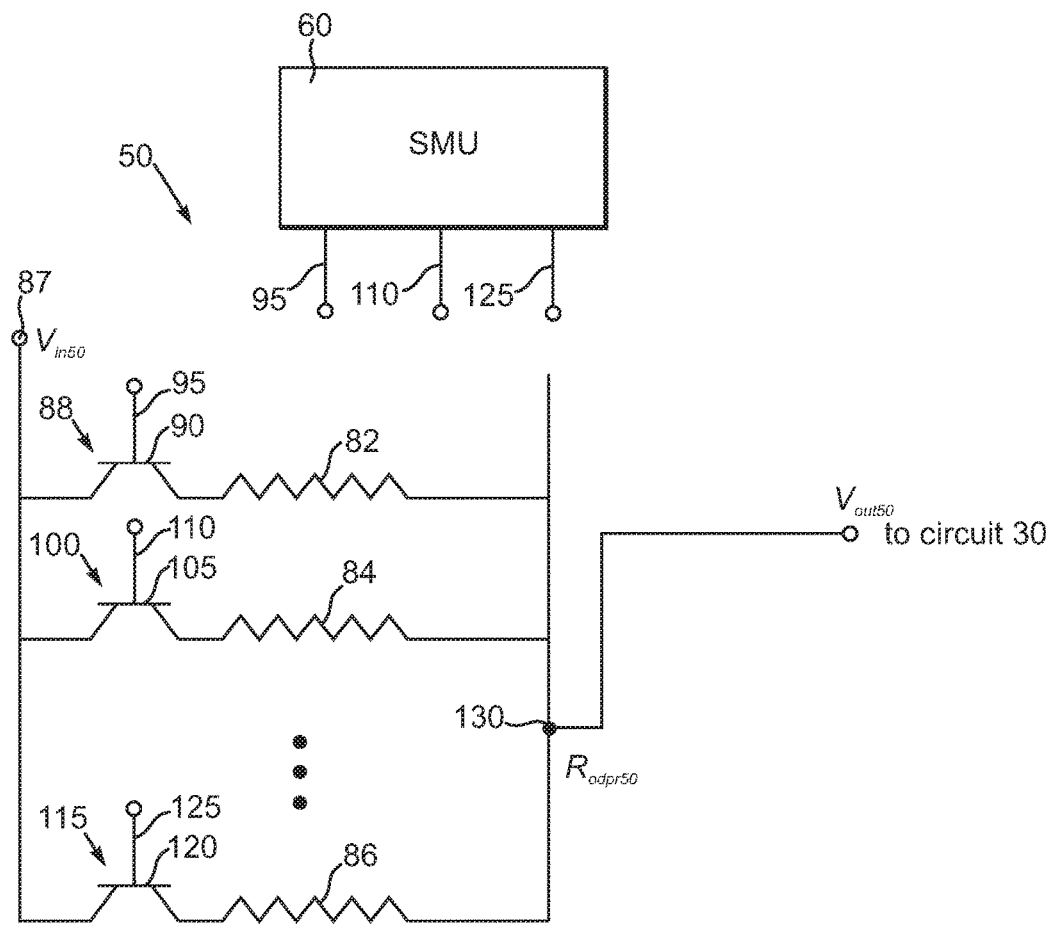
FIG. 2 is a schematic depiction of an exemplary precision resistor array and related logic.

Additional details regarding an exemplary arrangement for the ODPR arrays 50 and 55, can be understood by referring now to FIG. 2, which is a schematic diagram of the ODPR array 50. The following description of the ODPR array 50 will be illustrative of the other operational ODPR array 55 and any others, such as the replica ODPR array 67, on board the semiconductor chip device 10. As noted briefly above, the ODPR array 50 includes plural parallel connected resistors. Here, three such resistors 82, 84 and 86 are illustrated, however, and as the ellipses suggest, it should be understood that the number of resistors 82, 84 and 86 may number in the hundreds or thousands depending upon the complexity of the semiconductor chip device 10 shown in FIG. 1. The resistors 82, 84 and 86 can be composed from materials, such as doped polysilicon, metals, such as copper, gold, platinum or other resistor materials, and along with other components of the semiconductor chip device 10, be constructed using well-known integrated circuit fabrication techniques, such as plating, chemical vapor deposition, ion implantation, etching, photolithography, annealing, sputtering or the like. The resistor 82 is switchably connected to an input voltage source 87 with some input voltage $V_{in50}$ by way of a switch 88, which can be a field effect transistor as depicted or optionally some other type of switch, such as a bi-polar transistor or other type of switching device. Here, the gate 90 of the transistor is connected to control line 95, which receives a control signal from the SMU 60 shown in FIG. 1. The resistor 84 is similarly switchably connected to the input voltage source 87 with the input voltage $V_{in50}$ by way of a transistor 100, which can be like the transistor 88. The gate 105 of the transistor 100 is connected to control line 110, which receives a control signal from the SMU 60 shown in FIG. 1. Finally, the resistor 86 is similarly switchably connected to the input voltage source 87 with the input voltage $V_{in50}$ by way of a transistor 115, which can be like the transistor 88. The gate 120 of the transistor 115 is connected to control line 125, which receives a control signal from the SMU 60. In this way, the SMU 60 shown in FIG. 1 can turn on or off the transistors 88, 100 and 115 to selectively vary the resistance $R_{odpr50}$ at the common output 130 of the resistors 82, 84 and 86. The common output 130 is tied to $V_{out50}$ which is delivered to the impedance compensation circuit 30.

Figure 3:
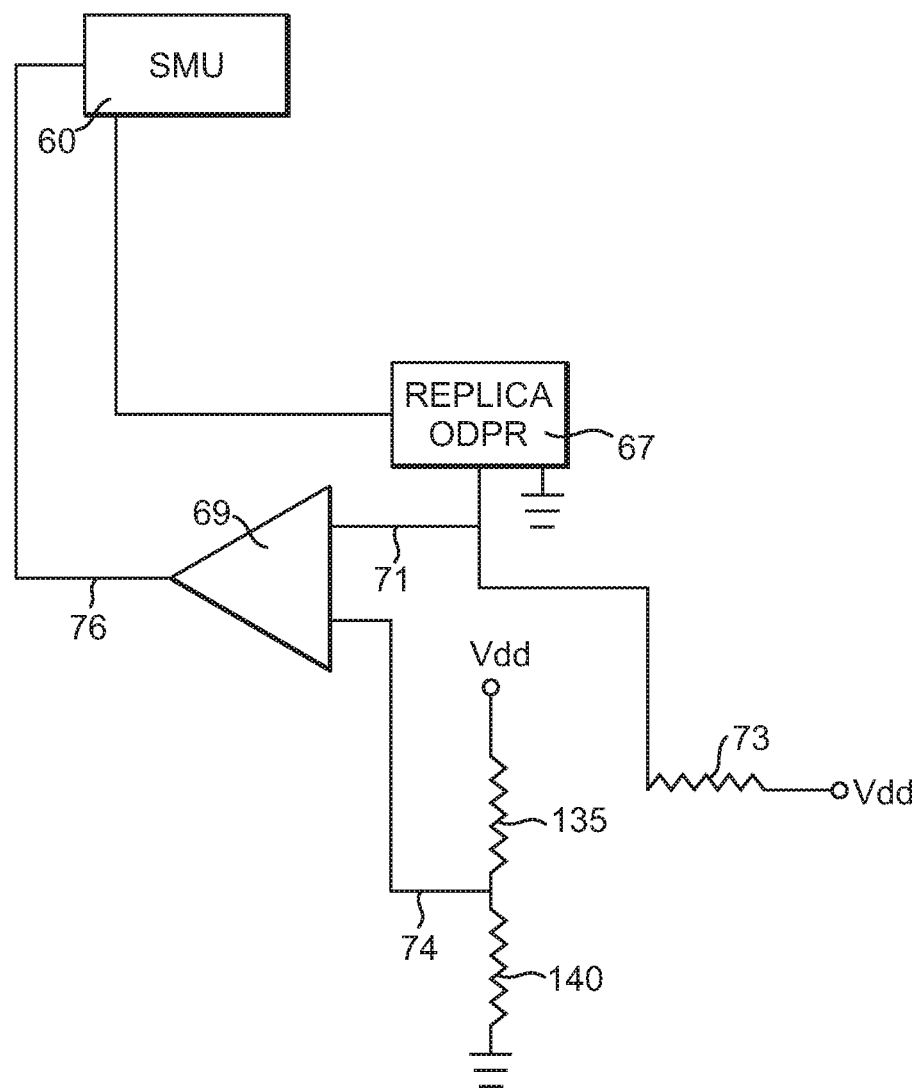
FIG. 3 is a schematic depiction of an exemplary comparator circuit and related components.

Additional details of the comparator circuit 69 shown in FIG. 1 will now be described in conjunction with FIG. 3, which is a block diagram depicting the comparator circuit 79, the SMU 60 and a few other components. The replica ODPR array 67 is connected to the input 71 and ground. As noted above, the input 71 is the replica ODPR array 67 output combined with the external high precision resistor 73 to form a voltage divider. The other input 74 to the comparator circuit 74, which acts as the reference for the input 71, is connected to an integrated matched/identical resistor pair, of resistors 135 and 140, of equal value that forms a voltage divider between Vdd and ground. The resistor pair of resistors 135 and 140 are located on the semiconductor chip device 10 and will have the same resistor value and hence always the same reference voltage. The output 76 of the comparator circuit 69 will be become zero when the voltage at the input 71 becomes equal to the voltage at the input 74. For this to occur, the resistance of the replica ODPR array 67 needs to be equal to the resistance of the external high precision resistor 73.

Figure 4:
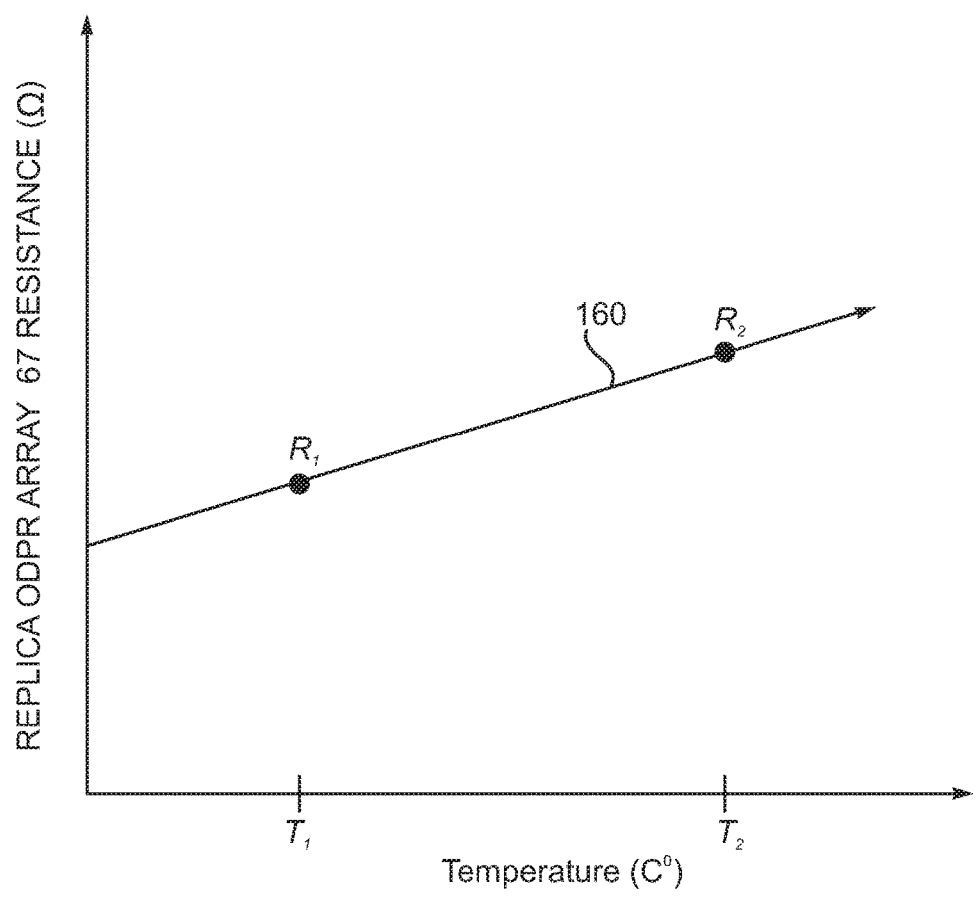
FIG. 4 is an exemplary graph depicting replica precision resistor array resistance as a function of temperature characterization.

An exemplary calibration procedure for calibrating the ODPR arrays 50 and 55 will described now in conjunction with FIGS. 1, 2, 4, 5 and 6. The calibration procedure can be broken out into three main activity groups: (1) temperature coefficient determination for the replica ODPR 67 depicted in FIG. 1; (2) the determination of resistance offset values for each of the operational ODPR arrays 50 and 55; and (3) run time dynamic calibration of the operational ODPR arrays 50 and 55. The temperature coefficient determination for the replica ODPR array 67 will now be described in conjunction with FIGS. 1, 2 and 4. After singulation of the semiconductor chip device 10 and mounting thereof to a package substrate or other circuit, the resistance behavior of the replica ODPR array 67 is characterized by initially choosing a combination of resistors (like the resistors 83, 84 and 86 in FIG. 2) of the replica ODPR array 67 to set the resistance of the ODPR array 67 to some target value. For example, the values of $Z_{target15}$ and $Z_{target17}$ for the I/O logic blocks 15 and 17, might, in a particular circumstance, be 200Ω. The value of 200Ω is used herein merely for convenience. Accordingly, the replica ODPR array 67 is initially set to a resistance of 200Ω. The semiconductor chip device 10 is then heated, in an oven or otherwise, and the resistance of the replica ODPR array 67 is measured at at least two temperatures $T_1$ and $T_2$. At temperature T1, the resistance of the replica ODPR array 67 is adjusted until it matches with the precision external resistor 73, at which point the output 76 of the comparator circuit 69 becomes zero. The measured resistance of the replica ODPR array 67 at temperature $T_1$ is $R_1$. Next, the temperature is raised to $T_2$. When the temperature is raised to $T_2$, the resistance of the replica ODPR array 67 will change and hence no longer be equal to the resistance of the external precision resistor 73, resulting in the output 76 of the comparator circuit 69 being non-zero. The SMU 69 then chooses a new combination(s) of resistors (like the resistors 83, 84 and 86 in FIG. 2) until the output 76 of the comparator circuit 69 again becomes zero, and records the new resistance $R_2$ for temperature $T_2$. The measured resistance values $R_1$ and $R_2$ at temperatures $T_1$ and $T_2$ are shown in the plot 160 in FIG. 4. FIG. 4 represents a linear temperature versus resistance curve 160 although something other than linear could possibly be encountered. Here, two values of resistance $R_1$ and $R_2$ for two temperatures $T_1$ and $T_2$ are used, however, additional temperatures and measured resistance values could be used as well. With the measured resistance values $R_1$ and $R_2$, a temperature coefficient, TempCoeff is given by:

$$TempCoeff = \frac{R_2 - R_1}{T_2 - T_1} \quad (1)$$

The value of TempCoeffis stored as a fuse parameter in the fuses 62 shown in FIG. 1 for subsequent use by all of the operational ODPR arrays 50 and 55 during run time calibration to be described below. Note the semiconductor chip device 10 can be constructed with more than one replica ODPR array 67. This might be desirable where the semiconductor chip device 10 is relatively large or otherwise exhibits significant variations in operating temperatures across its expanse. Thus, the characterization process just described would be repeated for the other replica ODPR arrays. This measurement of replica ODPR resistance versus temperature can be made for various numbers of representative parts depending upon what turns out to be the actual variations between replica ODPR values. For example, if the replica ODPR resistance values, lets say in FIG. 4, for a couple of sampled chips are very closely correlated then it may be possible to only test a limited number of the chips of a wafer.

Figure 5:
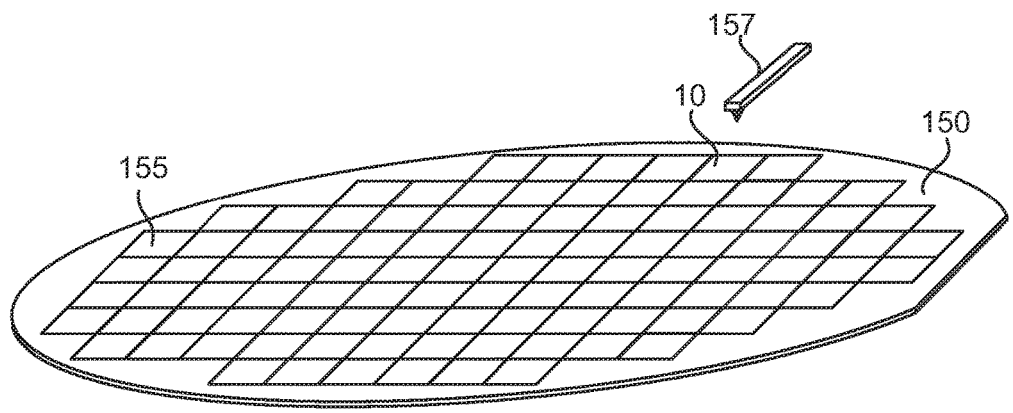
FIG. 5 is a pictorial view of an exemplary semiconductor wafer.
Figure 6:
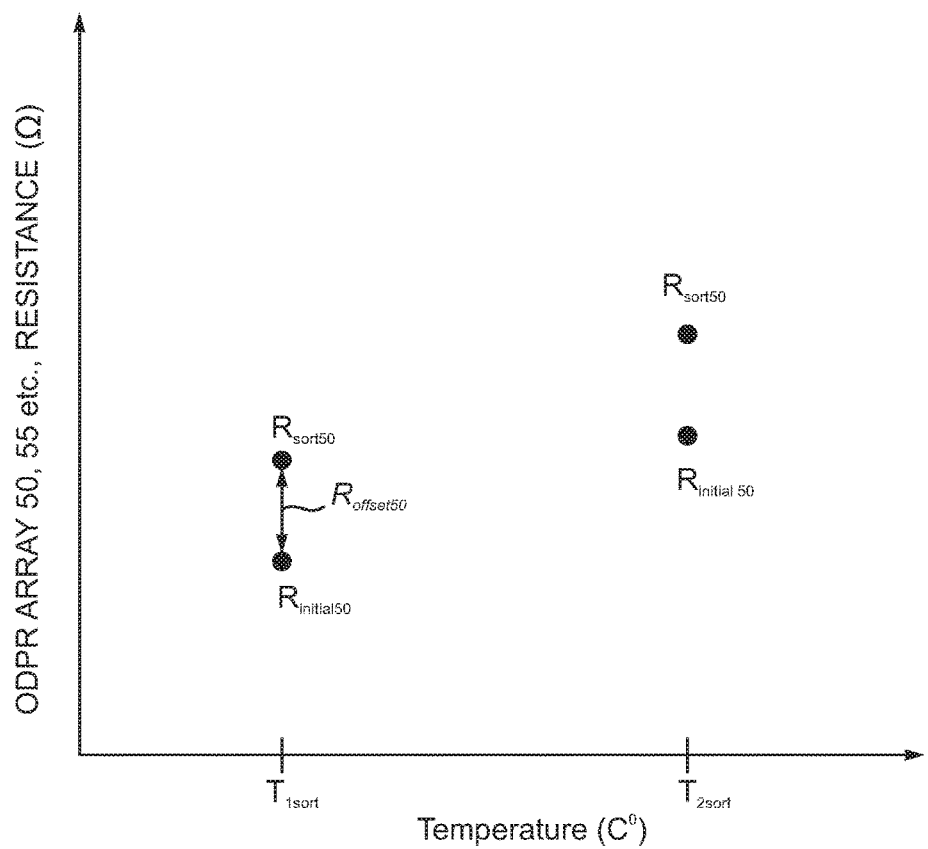
FIG. 6 is an exemplary graph depicting resistance offset measurement.

There is no guarantee that the replica ODPR array 67 will exactly mimic the resistance verus temperature behavior of the operational ODPR arrays 50 and 55. Accordingly, it is desirable to quantify how much each of the operational ODPR arrays 50 and 55 deviates or offsets from the replica ODPR array 67 behavior, i.e, deviates or offsets from the resistance versus temperature plot 160 shown in FIG. 4. That determination of resistance offset values for each of the operational ODPR arrays 50 and 55 will now be described in conjunction with FIGS. 1, 5 and 6. Note that FIG. 5 is a pictorial view of an exemplary semiconductor wafer 150 prior to singulation. The wafer 150 includes plural semiconductor chips, one of which is the semiconductor chip device 10 and many others, one of which is labeled 155, for example. With the value of TempCoefffrom Equation (1) in hand, the determination of resistance offset values for each of the ODPR arrays 50 and 55 is performed. As noted above, a given impedance compensation circuit, such as the impedance compensation circuit 30 shown in FIG. 1, has a target impedance $Z_{target15}$. Prior to wafer sort test, a resistance value of the ODPR array 50 is set to some initial value $R_{initial50}$ as graphically depicted in the graph 162 of ODPR array 50, 55 resistance versus wafer sort temperature shown in FIG. 6. This resistance setting is by way of some combination of the resistors 82, 84 and 86 of the ODPR array 50. This initial set resistance value $R_{initial50}$ is again based on $Z_{target15}$ and is typically the same as the initial value selected for the characterization of the replica ODPR array 67, which in this example is 200Ω. During a wafer sort test of the wafer 150 shown in FIG. 5, the wafer 150, and thus the chip device 10, is heated and at a selected sort test temperature, $T_{1sort}$, a resistance value $R_{sort50}$ of a given ODPR array 50 is measured using, for example a probe instrument 157. If $R_{sort50}$ is deviated from $R_{initial50}$ the resistor control codes (i.e., the selection of groups of the resistors 82, 84 and 86 shown in FIG. 2) of the ODPR array 50 are adjusted until the measured value $R_{sort50}$ reaches the desired target resistance value corresponding to the target impedance value $Z_{target15}$ for the corresponding impedance compensation circuit 30 of the I/O block 15. From this value $R_{sort50}$ and using the temperature coefficient TempCoefffrom the previous step, the resistance offset value $R_{offset50}$ for the ODPR array 50 is given by:

$$R_{offset50} = R_{sort50} - (TempCoeff \cdot T_{1sort}) \quad (2)$$

The offset value $R_{offset50}$ represents the deviations from the curve 160 for the replica ODPR array 67 shown in FIG. 4. This is repeated for the other ODPR array 55 such that prior to wafer sort test, an initial resistance value $R_{initial55}$ is set for the ODPR array 55 and then during wafer sort test at the selected sort test temperature, $T_{1sort}$, a resistance value $R_{sort55}$ of the ODPR array 55 is measured individually and resistor control codes (i.e., the selection of groups of the resistors 82, 84 and 86 shown in FIG. 2) of the ODPR array 55 are adjusted until the measured value $R_{sort55}$ reaches the desired target resistance value corresponding to the target impedance value $Z_{target17}$ for the corresponding impedance compensation circuit 45 of the I/O block 17, and so on for the other operational ODPR arrays and I/O blocks. The offset value $R_{offset55}$ represents the deviation from the curve 160 for the replica ODPR array 67 shown in FIG. 4. Note the offset values $R_{offset50}$ and $R_{offset55}$ can be positive or negative. Note that only a single sort test temperature $T_{sort1}$ and a single offset value, such as $R_{offset50}$, is needed for a given ODPR array 50. However, the data could be run again for additional accuracy at other sort test temperatures, such as $T_{sort2}$. The offset values $R_{offset50}$ and $R_{offset55}$ for each of the ODPR arrays 50 and 55 can be stored as fuse parameters in the fuses 62 or elsewhere, for use by the operational ODPR arrays 50 and 55 during run-time dynamic calibration later.

The run time dynamic calibrations of the ODPR arrays 50 and 55 will now be described in conjunction with FIG. 1. At power up, at various intervals during run time in operational mode, or depending upon temperature variations or changes in the configurations of the semiconductor chip device 10 (such as peripheral connection or disconnection) as determined by SMU 60, each individual ODPR arrays 50 and 55 needs to be calibrated to compensate for the temperature variations. This is required to maintain the accuracy of ODPR resistance values to meet the requirements of the impedance compensation circuits 30 and 45 of the I/O blocks 15 and 17, respectively. Assume that a given ODPR array 50 is initially set to a $R_{target50}$ of 200Ω. The SMU 60 monitors the current temperature $T_{odpr50}$ of the semiconductor chip device 10 proximate the given ODPR array 50 using the remote temperature sensing diode 70 located near the ODPR 50 at regular intervals. If the SMU 60 senses that the temperature $T_{odpr50}$ has increased (or decreased) more than some preselected temperature change $\Delta T_{odpr50}$, then the SMU 60 commences a new calibration of the ODPR array 50. For example, assume that the maximum permissible value for $\Delta T_{odpr50}$ is 8.0° C. and the SMU 60 senses that the temperature $T_{odpr50}$ has increased 10.0° C., where the maximum permissible value of $\Delta T_{odpr50}$ could be other than 8.0° C. Since the temperature increase of 10.0° C. exceeds 8.0° C., a requirement for a new calibration is triggered. The SMU 60 then uses the current measured temperature $T_{odpr50}$, the previously calculated temperature coefficient TempCoeff and the resistance offset value $R_{offset50}$ stored in the fuses 62, to calculate the current resistance value $R_{odpr50}$ of the ODPR array according to:

$$R_{odpr50} = (TempCoeff \cdot T_{odpr50}) + R_{offset50} \quad (3)$$

The SMU 60 then compares the calculated value of $R_{odpr50}$ with the desired value $R_{target50}$ of 200Ω. For example, the calculated value of $R_{odpr50}$ might be 204Ω or 4Ω higher than desired due to the temperature increase. The SMU 60 next adjusts the resistor control codes (i.e., selects a different combination of the resistors 82, 84 and 86) of the ODPR array 50 such that the resistance of the ODPR array 50 is brought back to 200Ω. This process is repeated for the other ODPR array 55 using the temperature sensing diode 75, Equation (3) but corresponding values of $R_{target55}$, $R_{offset55}$, $T_{odpr55}$ and maximum permissible $\Delta T_{odpr55}$, and so on for any other ODPR arrays. The SMU 60 can perform these new calibrations in response to temperature changes, on power on start up, and/or periodically. Maximum desirable values for $\Delta T_{odpr55}$ can be based on a variety of factors, such as the thermal characteristics of the ODPR arrays 50 and 55 and the allowable tolerances of ODPR array resistance values specified particular impedance compensation circuits. The thermal characteristics of a particular ODPR array will be implementation specific and should be validated with actual testing. For example, if the temperature variation of an ODPR array is 1% variation in resistance for 15° C. temperature variation and the required resistance ODPR resistance tolerance for a given impedance compensation circuit is +/−1%, then maximum desirable values for $\Delta T_{odpr55}$ should be less than 15° C.

Figure 7:
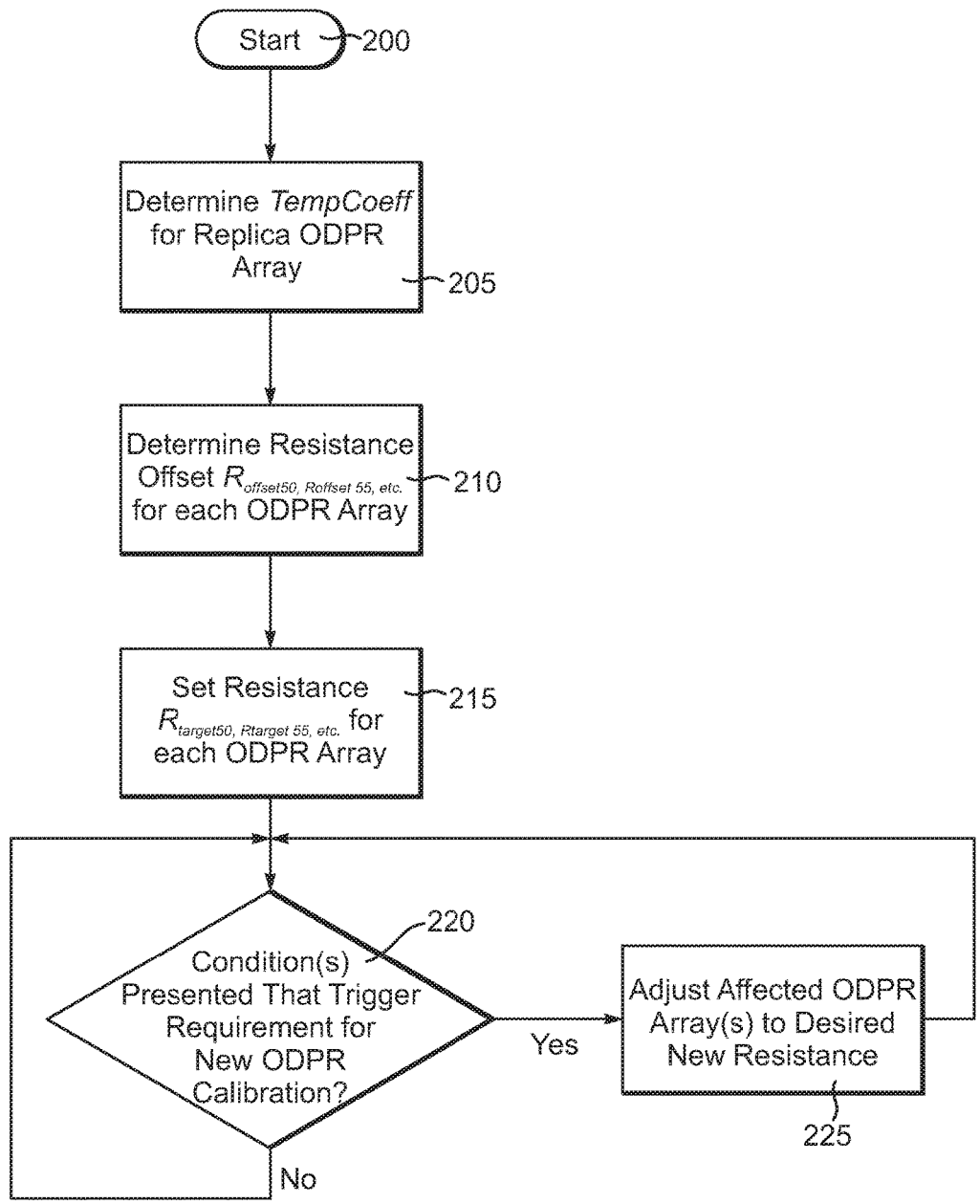
FIG. 7 is a flow chart of an exemplary precision resistor array calibration procedure.

An exemplary process flow for calibrating the ODPR arrays 50 and 55 may be understood by referring now to FIGS. 1-6 and to the flow chart depicted in FIG. 7. After start at step 200 in FIG. 5, at step 205 the temperature coefficient TempCoeff of the replica ODPR array 67 is determined as disclosed herein. If there are multiple replica ODPR arrays, then this step is repeated as necessary. Next at step 210, the resistance offset $R_{offset50}$, $R_{offset55}$, etc. is determined for each operational ODPR array 50 and 55 as disclosed herein. Next at step 215, each ODPR array 50 and 55 is set to a target resistance $R_{target50}$, $R_{target55}$ as disclosed herein. At step 220, the semiconductor chip device 10 looks for a condition(s) that triggers a requirement for a new ODPR calibration. There are many such conditions that can trigger a requirement for a new ODPR calibration. Power on start up, changes in sensed temperatures predictive of thermal drift, changes in peripherals connected to the semiconductor chip device 10 have already been discussed, but there are others. For example, device aging, due to electromigration, polysilicon dopant migration or other aging factors, can be compensated for using the disclosed techniques. The semiconductor chip device 10 can sense that operation time has exceeded some threshold suggesting that aging issues will have caused drift in resistances of the ODPR arrays 50 and 55. When that time threshold is sensed, a new calibration is triggered. Other possibilities include changes in device power or clocking/overclocking states. If no condition(s) are presented at step 220, then the process loops back to again look for a condition(s) that triggers a requirement for a new ODPR calibration. If, however, at step 220 condition(s) are presented, then at step 225 new ODPR calibrations are performed as disclosed herein. Following step 225, the process loops back to step 220.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:
1. An apparatus, comprising:
a semiconductor chip;
a precision resistor array on the semiconductor chip;
a replica precision resistor array on the semiconductor chip, the replica precision resistor array being configured to mimic the resistance behavior of the precision resistor array and having a characteristic resistance that is a function of temperature; and wherein the semiconductor chip being configured to calibrate the precision resistor array using the characterized resistance as a function of temperature, a resistance offset of the precision resistor array relative to the characterized resistance as a function of temperature, and a temperature of the precision resistor array.

2. The apparatus of claim 1, comprising an I/O logic block operable to drive signals to an I/O.

3. The apparatus of claim 2, wherein the I/O logic block comprises an impedance compensation circuit operable to maintain the driven signals at a target impedance using a resistance of the precision resistor array.

4. The apparatus of claim 1, comprising a temperature sensor proximate the precision resistor array to sense the temperature of the precision resistor array.

5. The apparatus of claim 1, comprising a storage device to store the characterized resistance as a function of temperature of the replica precision resistor array and the resistance offset of the precision resistor array relative to the characterized resistance as a function of temperature.

6. The apparatus of claim 1, comprising plural replica precision resistor arrays positioned at different positions on the semiconductor chip.

7. A method of manufacturing, comprising:
fabricating a precision resistor array on a semiconductor chip;
a replica precision resistor array on the semiconductor chip, the replica precision resistor array being configured to mimic the resistance behavior of the precision resistor array and having a characteristic resistance that is a function of temperature; and
fabricating logic on the semiconductor chip configured to calibrate the precision resistor array using the characterized resistance as a function of temperature, a resistance offset of the precision resistor array relative to the characterized resistance as a function of temperature, and a temperature of the precision resistor array.

8. The method of claim 7, comprising fabricating an I/O logic block and an I/O on the semiconductor chip, the I/O logic block being operable to drive signals to the I/O.

9. The method of claim 8, wherein the I/O logic block comprises an impedance compensation circuit operable to maintain the driven signals at a target impedance using a resistance of the precision resistor array.

10. The method of claim 7, comprising fabricating a temperature sensor proximate the precision resistor array to sense the temperature of the precision resistor array.

11. The method of claim 7, fabricating a storage device on the semiconductor chip to store the characterized resistance as a function of temperature of the replica precision resistor array and the resistance offset of the precision resistor array relative to the characterized resistance as a function of temperature.

12. The method of claim 7, comprising fabricating plural replica precision resistor arrays positioned at different positions on the semiconductor chip.

13. A method of operating a semiconductor chip having a precision resistor array and a replica precision resistor array being configured to mimic the resistance behavior of the precision resistor array, comprising:
characterizing the resistance of the replica precision resistor array as a function of temperature;
determining a resistance offset of the precision resistor array relative to the characterized resistance as a function of temperature; and
calibrating the precision resistor array using the characterized resistance as a function of temperature, the resistance offset of the precision resistor array relative to the characterized resistance as a function of temperature, and a temperature of the precision resistor array.

14. The method of claim 13, comprising performing the calibration of the precision resistor array when a condition triggering a requirement for new calibration is presented.

15. The method of claim 14, when the condition comprises a temperature change of the precision resistor array above a preselected threshold, a change in peripheral connected to the semiconductor chip or an age of the semiconductor chip.

16. The method of claim 13, wherein the semiconductor chip comprises an I/O logic block and an I/O, the method comprising using the I/O logic block to drive signals to the I/O.

17. The method of claim 16, wherein the I/O logic block comprises an impedance compensation circuit operable to maintain the driven signals at a target impedance using a resistance of the precision resistor array.

18. The method of claim 13, comprising using a temperature sensor proximate the precision resistor array to sense the temperature of the precision resistor array.

19. The method of claim 13, wherein the semiconductor chip comprises a storage device, the method comprising storing in the storage device the characterized resistance as a function of temperature of the replica precision resistor array and the resistance offset of the precision resistor array relative to the characterized resistance as a function of temperature.

20. The method of claim 13, wherein the semiconductor chip comprises plural replica precision resistor arrays positioned at different positions on the semiconductor chip.

* * * * *